(12) United States Patent
Richardson

(10) Patent No.: US 8,292,445 B2
(45) Date of Patent: *Oct. 23, 2012

(54) OPTICAL SYSTEM FOR A LIGHT EMITTING DIODE WITH COLLECTION, CONDUCTION, PHOSPHOR DIRECTING, AND OUTPUT MEANS

(75) Inventor: Brian E Richardson, Campbell, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/359,952

(22) Filed: Jan. 27, 2012

(65) Prior Publication Data

US 2012/0127694 A1    May 24, 2012

Related U.S. Application Data

(63) Continuation of application No. 12/456,126, filed on Jun. 11, 2009, now Pat. No. 8,152,318.

(51) Int. Cl.
*F21V 9/16* (2006.01)
*F21V 7/04* (2006.01)

(52) U.S. Cl. .................. 362/84; 362/296.05; 362/297; 362/300; 362/308

(58) Field of Classification Search .......... 362/84, 362/268, 293, 307, 308, 310, 311.02, 328, 362/329, 331, 332, 335, 347, 296.05, 297, 362/300, 301, 311.06, 343, 346, 349
See application file for complete search history.

(56) References Cited

U.S. PATENT DOCUMENTS

| | | |
|---|---|---|
| 223,898 A | 1/1880 | Edison |
| 2,673,923 A | 3/1954 | Williams |
| 2,971,083 A | 2/1961 | Phillips et al. |
| 4,172,631 A | 10/1979 | Yevick |
| 4,392,187 A | 7/1983 | Bornhorst |
| 4,566,935 A | 1/1986 | Hornbeck |
| 4,596,992 A | 6/1986 | Hornbeck |
| 4,615,595 A | 10/1986 | Hornbeck |
| 4,662,746 A | 5/1987 | Hornbeck |
| 4,710,732 A | 12/1987 | Hornbeck |
| 4,956,619 A | 9/1990 | Hornbeck |
| 4,972,306 A | 11/1990 | Bornhorst |
| 5,028,939 A | 7/1991 | Hornbeck et al. |
| 5,083,252 A | 1/1992 | McGuire |
| 5,126,886 A | 6/1992 | Richardson et al. |
| 5,217,285 A | 6/1993 | Sopori |
| 5,221,987 A | 6/1993 | Laughlin |
| 5,319,491 A | 6/1994 | Selbrede |
| 5,396,350 A | 3/1995 | Beeson |
| 5,467,208 A | 11/1995 | Kokawa et al. |

(Continued)

FOREIGN PATENT DOCUMENTS

EP     814300     12/1997

(Continued)

*Primary Examiner* — Thomas Sember

(74) *Attorney, Agent, or Firm* — Renner, Otto, Boisselle & Sklar, LLP

(57) ABSTRACT

An optical system with an LED light source utilizes a base with an inverted conical shape to conduct light to a phosphor layer. The phosphor layer emits light from both upper and lower surfaces. The base and a substantially mirror image cap element facilitate efficient extraction of the phosphor-generated light from the optical system so that the output of the system is omni-directional light suitable for common lighting applications. The system is very efficient in that nearly all the light generated by the LED is transmitted to the phosphor layer, and nearly all the light emitted from the phosphor layer is output from the system.

18 Claims, 6 Drawing Sheets

U.S. PATENT DOCUMENTS

| | | | |
|---|---|---|---|
| 5,631,895 | A | 5/1997 | Okada et al. |
| 5,825,548 | A | 10/1998 | Bornhorst et al. |
| 5,936,772 | A | 8/1999 | Suzuki |
| 5,953,469 | A | 9/1999 | Zhou |
| 5,995,690 | A | 11/1999 | Kotz et al. |
| 6,040,937 | A | 3/2000 | Miles |
| 6,048,081 | A | 4/2000 | Richardson |
| 6,350,041 | B1 | 2/2002 | Tarsa |
| 6,360,033 | B1 | 3/2002 | Lee et al. |
| 6,421,103 | B2 | 7/2002 | Yamaguchi |
| 6,421,104 | B1 | 7/2002 | Richard |
| 6,438,283 | B1 | 8/2002 | Karaguleff et al. |
| 6,502,961 | B1 | 1/2003 | Richardson |
| 6,565,233 | B1 | 5/2003 | Richardson |
| 6,674,562 | B1 | 1/2004 | Miles |
| 6,729,734 | B2 | 5/2004 | Childers et al. |
| 6,768,572 | B2 | 7/2004 | Romanovsky |
| 6,771,325 | B1 | 8/2004 | Dewald et al. |
| 6,824,270 | B2 | 11/2004 | Kim et al. |
| 6,867,896 | B2 | 3/2005 | Miles |
| 6,924,945 | B1 | 8/2005 | Richardson |
| 6,974,232 | B1 | 12/2005 | Richardson |
| 7,080,932 | B2 | 7/2006 | Keuper |
| 7,123,216 | B1 | 10/2006 | Miles |
| 7,142,744 | B2 | 11/2006 | Walter et al. |
| 7,144,131 | B2 | 12/2006 | Rains |
| 7,177,498 | B2 | 2/2007 | Cizek |
| 7,286,296 | B2 | 10/2007 | Chaves et al. |
| 7,345,824 | B2 | 3/2008 | Lubart |
| 7,380,962 | B2 | 6/2008 | Chaves et al. |
| 7,447,397 | B1 | 11/2008 | Maki et al. |
| 7,499,206 | B1 | 3/2009 | Richardson |
| 7,709,811 | B2 | 5/2010 | Conner |
| 2002/0031294 | A1 | 3/2002 | Takeda et al. |
| 2002/0044720 | A1 | 4/2002 | Brophy et al. |
| 2002/0105709 | A1 | 8/2002 | Whitehead et al. |
| 2004/0076396 | A1 | 4/2004 | Suga |
| 2004/0109105 | A1 | 6/2004 | Nagakubo et al. |
| 2005/0018147 | A1 | 1/2005 | Lee et al. |
| 2005/0057731 | A1 | 3/2005 | Lee et al. |
| 2005/0221473 | A1 | 10/2005 | Dubin et al. |
| 2005/0243570 | A1 | 11/2005 | Chaves et al. |
| 2005/0248827 | A1 | 11/2005 | Starkweather et al. |
| 2005/0270796 | A1 | 12/2005 | Ichikawa |
| 2006/0070379 | A1 | 4/2006 | Starkweather et al. |
| 2007/0133224 | A1 | 6/2007 | Parker |
| 2007/0176887 | A1 | 8/2007 | Uehara |
| 2007/0211487 | A1 | 9/2007 | Sormani |
| 2008/0117500 | A1 | 5/2008 | Narendran et al. |
| 2008/0170296 | A1 | 7/2008 | Chaves et al. |
| 2008/0247169 | A1 | 10/2008 | Zou |
| 2009/0011609 | A1 | 1/2009 | Ramkumar |
| 2009/0052158 | A1 | 2/2009 | Bierhuizen et al. |
| 2009/0064993 | A1 | 3/2009 | Ghosh |
| 2009/0067179 | A1 | 3/2009 | Chaves et al. |
| 2009/0225529 | A1 | 9/2009 | Falicoff et al. |
| 2009/0262368 | A1 | 10/2009 | Leong |
| 2009/0273727 | A1 | 11/2009 | Kubota et al. |
| 2009/0296368 | A1 | 12/2009 | Ramer |
| 2010/0085773 | A1 | 4/2010 | Richardson |
| 2010/0172138 | A1 | 7/2010 | Richardson |
| 2010/0220492 | A1 | 9/2010 | Richardson |
| 2010/0315802 | A1 | 12/2010 | Richardson |
| 2010/0315836 | A1 | 12/2010 | Richardson |
| 2010/0328748 | A1 | 12/2010 | Richardson |

FOREIGN PATENT DOCUMENTS

| | | |
|---|---|---|
| EP | 867747 | 9/1998 |
| EP | 969305 | 1/2000 |
| EP | 969306 | 1/2000 |
| EP | 1215526 | 6/2002 |
| EP | 1291833 | 3/2003 |
| EP | 2045633 | 4/2009 |
| GB | 663840 | 12/1951 |
| JP | 2002229017 | 8/2002 |
| WO | 2004068183 | 8/2004 |
| WO | 2008060335 | 5/2008 |
| WO | 2009024952 | 2/2009 |

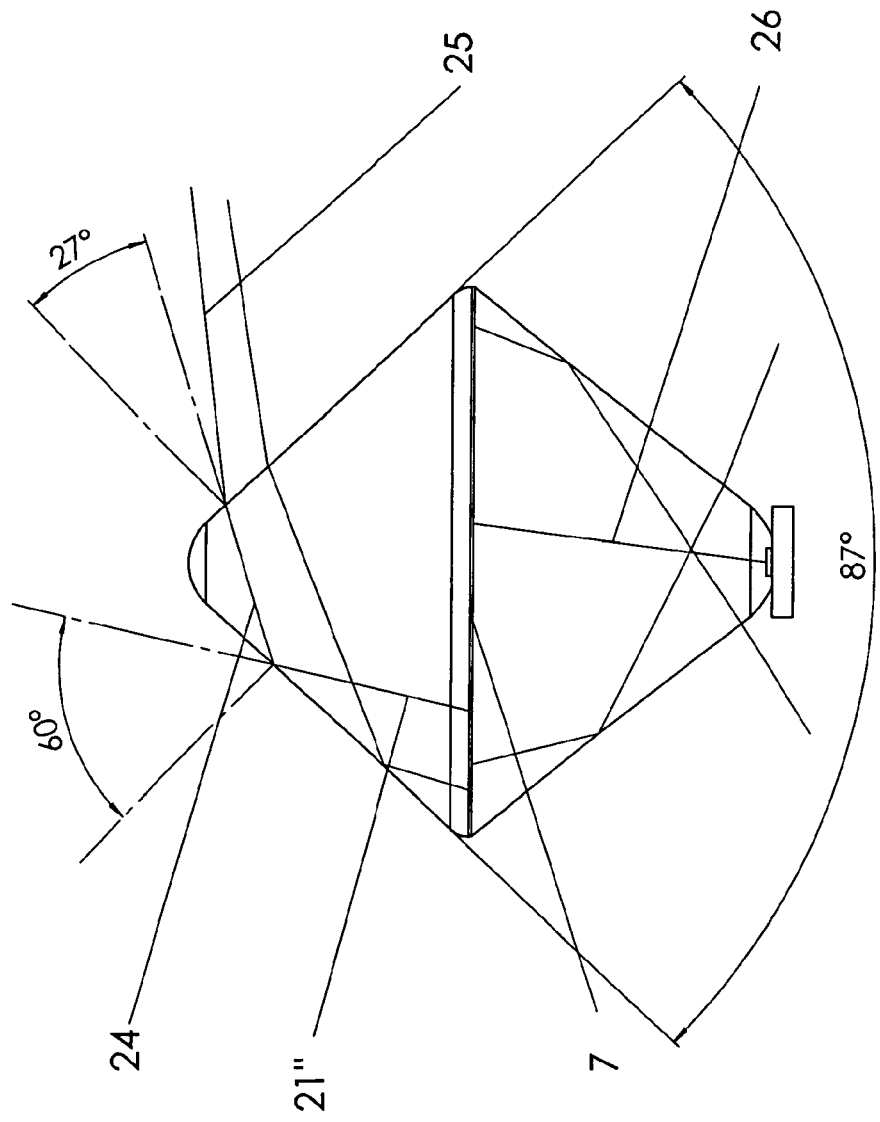

OPTICAL SYSTEM FOR A LIGHT EMITTING DIODE WITH COLLECTION, CONDUCTION, PHOSPHOR DIRECTING, AND OUTPUT MEANS

RELATED APPLICATION DATA

This application is a continuation of U.S. patent application Ser. No. 12/456,126, filed Jun. 11, 2009, the disclosure of which is incorporated herein by reference in its entirety.

FIELD OF THE INVENTION

This invention relates generally to extraction and control of light from a light emitting diode, LED, and more particularly is an optical system to improve the extraction of light from an LED, the direction of the light to a phosphor source, and the omni-directional extraction from the system of the light generated by the phosphor. The optical system directs the output light in a pattern that is similar to that of a conventional incandescent light bulb.

BACKGROUND OF THE INVENTION

Numerous products require an efficient source of white light that is omnidirectional. In many applications, the desired output would be similar to the output of a conventional light bulb, the breakthrough invention of Thomas Edison, U.S. Pat. No. 223,898, issued Jan. 27, 1880. A host of products has been designed around the output taught by this historic invention. Recently, fluorescent-based light bulbs have been developed to mimic the output of the Edison bulb. Many inventors are trying to develop a bulb with a similar output that is based on LED technology. There are many shortcomings with the devices that have to date been developed.

One of the problems inherent in the use of LEDs for general lighting is the creation of white light from the narrow wavelength of light that is generated by an LED. Early examples of LED lighting systems relied on a combination of many different colored LEDs to create white light. In more recent examples, the output from a blue LED has been used to irradiate phosphor so that a broad spectrum of yellow light is radiated. The combination of the yellow light with some of the blue light that is not absorbed by the phosphor creates a reasonable white light source. In the prior art LED systems, the phosphor has typically been placed in close proximity to the blue LED so that all of the blue light passes on to the phosphor. However, newer inventions, such as U.S. Pat. No. 6,350,041, High Output Radial Dispersing Lamp, by Eric Tarsa, issued Feb. 26, 2002; U.S. Pat. No. 7,080,932, LED with an Optical System, by Matthijs Keuper, issued Jul. 25, 2006; and U.S. Pat. No. 7,080,932, Optical Manifold for Light Emitting Diodes, by Julio Chaves, issued Jun. 3, 2008; all teach the location of the phosphor at a distance away from the LED. All of these inventions have a generally efficient method of coupling the LED light to the phosphor.

Some of the prior art devices are more elaborate and therefore more expensive than others. None of the prior art inventions teach how to efficiently extract the light from the phosphor. Further none of the prior art inventions teach a light source that produces an omni-directional light output that is similar to the output of the original Edison invention.

Accordingly, it is an object of the present invention to provide an optical system that extracts a high percentage of the light generated by a phosphor source.

It is a further object of the present invention to effectively couple blue light from an LED to the light produced from irradiated phosphor.

It is a further object of the present invention to create all of the desirable optical qualities of the Edison lamp at a cost that allows mass deployment of energy efficient LEDs.

SUMMARY OF THE INVENTION

The present invention is an optical system that is used to create white light from a package that is mechanically similar to a conventional light bulb. The system efficiently directs blue light from an LED toward a phosphor layer that is at a substantial distance from the LED. The system also allows for most of the generated light to be output from the system without being absorbed by the phosphor or by the LED.

An advantage of the optical system of the present invention is that it creates an output substantially equivalent to the output of a conventional light bulb.

Another advantage of the optical system of the present invention is that it provides an efficient, cost-effective construction of a path for light to be transmitted from the LED to a phosphor layer.

Yet another advantage of the optical system is that it allows substantially all of the light generated by the system to be output from the system.

These and other objectives and advantages of the present invention will become apparent to those skilled in the art in view of the description of the best presently known mode of carrying out the invention as described herein and as illustrated in the drawings.

BRIEF DESCRIPTION OF THE DRAWINGS

FIG. 6 is a side sectional view of the optical system showing TIR reflected light rays efficiently transmitted from the system.

DETAILED DESCRIPTION OF THE INVENTION

Figure 1:
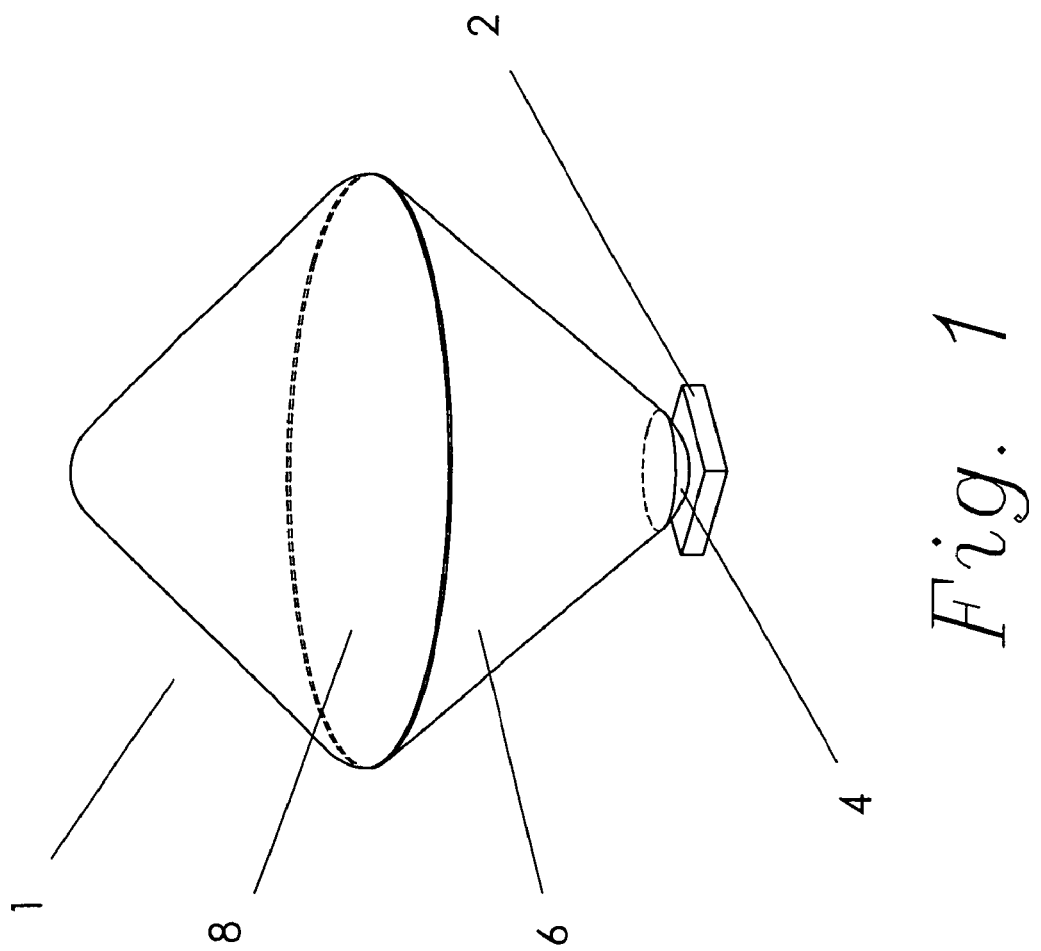
FIG. 1 is a perspective view of the optical system of the present invention.
Figure 2:
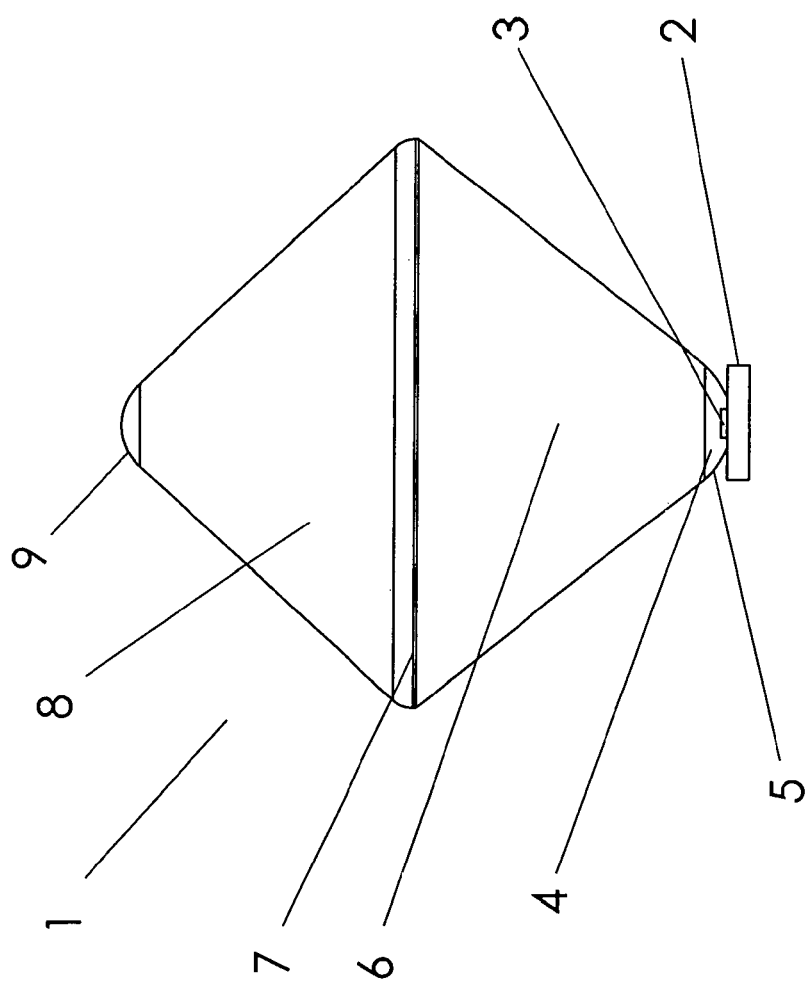
FIG. 2 is a side sectional view of the optical system.

Referring first to FIGS. 1 and 2, the optical system 1 of the present invention comprises a main body made from a base 6 and an upper conical cap 8. The main body of the optical system 1 is generally diamond shaped, with rounded point ends. The base 6 has generally the shape of an inverted cone. The cap 8 is also generally conical, but with a rounded base. The upper end 9 of the cap 8 and the lower end of the base 6 are both shown with a radius terminal area. The radius tips are not included for performance factors, but rather are included to eliminate sharp points that could injure the user. The rounded areas are for safety, not performance, reasons.

A light source, LED 3, is mounted on a PCB 2. The PCB 2 is chosen simply as a convenient method for mounting and supplying power to an LED 3. There are other materials and methods that could be used to supply power to the LED 3 that are known to those skilled in the art. The specific electronic circuitry used to power the system is not considered within the scope of this invention. The system could be powered and controlled by many currently known methods of powering and controlling LED based systems.

A reflector medium 4 area of base 6 is centered on a top side of the PCB 2. The LED 3 is situated within the area of the base 6 that is covered by the reflector medium 4. The reflector medium 4 is typically formed from a polymer. The reflector medium 4 could also be oil or another material that has a high index of refraction. The reflector medium 4 generally has a curved shape. In some cases where the geometry of the LED 3 and the reflector medium 4 do not ensure TIR in the area of the reflector medium 4, a reflective coating 5 such as aluminum or silver or some other reflective material is applied to the reflector medium 4.

Near the midpoint of the main body of the optical system 1, at an area where the diameter of the base 6 is much greater than the reflector medium 4, there is a thin phosphor layer 7. A lower edge of cap 8 just above the phosphor layer 7 is rounded for ease of handling and safety reasons, just as the tips of the main body are rounded.

Figure 3:
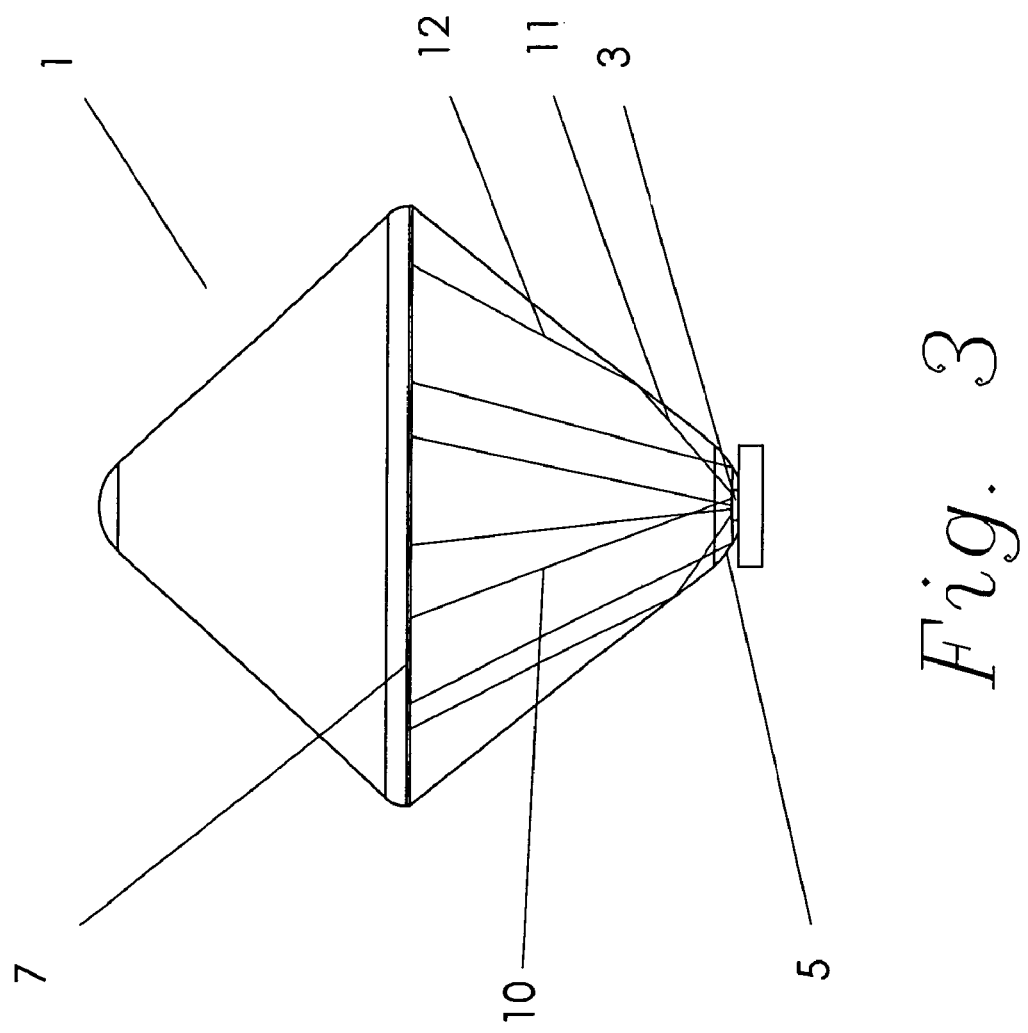
FIG. 3 is a side sectional view of the optical system showing light rays traveling from the LED to the phosphor layer.

Referring now to FIG. 3, light rays 10 originate at the LED 3, which is contained within the reflector medium 4. The light rays 10 from the LED 3 travel through the transparent material of the reflector medium 4 and the base 6. The reflector medium 4 and the base 6 are preferably made from a high transmission material. The reflector medium 4 and the base 6 may be constructed as one continuous piece of material or two different materials with different optical properties. The material used for the reflector medium 4 must be chosen bearing in mind that the reflector medium 4 must remain transparent when in contact with the sometimes hot LED. Ideally the index of refraction of the material used for the reflector medium 4 is as high as possible. Having a high refractive index material in contact with the LED 3 improves the extraction of light from the LED 3. The base 6 should also be made from a high index of refraction material. The cap 8 is not in contact with the LED and therefor does not realize high temperatures. Many different materials are available that have a high index of refraction and operate at only low temperatures. Preferably, but not strictly necessarily, these two components would be polymers. The LED rays 10 travel on a direct path from the LED 3 to the phosphor layer 7.

A second group of light rays 11 generated by LED 3 do not travel directly to the phosphor layer 7. The second light rays 11 emanate from the LED 3 at an angle that causes the light rays 11 to first strike an outer surface of the base 6. The geometry of the base 6 and the LED 3 is such that the angle at which the light rays 11 strike the surface of base 6 is less than approximately 40 degrees from normal to the surface of the base 6. If the angle of incidence is less than 40 degrees, the light reflects off of the surface of the base 6. This type of reflection is total internal reflection, TIR, and effectively 100% of the light rays 11 are reflected. The 40 degree maximum angle required to allow TIR is a function of the index of refraction of the base 6 and the medium that surrounds the conical base 6.

In the case presented in the drawings, the material surrounding base 6 is air, with an index of refraction of 1. The index of refraction of the conical base 6 is 1.55. The equation that determines the TIR angle is:

> Angle from normal to the surface=arcsin (index of refraction of air/index of refraction of the base material)

TIR reflected rays 12 are redirected so that they do eventually strike the phosphor layer 7, as do the direct traveling light rays 10. Some light rays from the LED 3 strike the surface of the reflective medium 4. The light rays that strike the reflective medium 4 are reflected either from TIR or, when the geometry of the system is such that the angle that the light strikes the surface of the reflective medium 4 is not within the TIR range, the reflective material 5. Therefore essentially all the light from LED 3 is directed to the phosphor layer 7.

In summary, there are three paths that light generated by the LED 3 can take to reach the phosphor layer 7—a direct path, TIR off the surface of the base 6, and reflection off the reflective medium 4. A key characteristic of the present invention is that nearly all of the light from the LED 3 does find its way to the phosphor layer 7. Only a very small amount of generated light is lost to absorption from the polymer(s) of the reflective medium 4 and the base 6. Another negligible light loss factor is the small amount of absorption that occurs when light strikes the reflective coating 5.

The light generated by the LED 3 is preferably in the blue or ultraviolet wavelength. When the light strikes the phosphor layer 7, the phosphor in the phosphor layer 7 absorbs the blue or ultraviolet light from the LED 3 and radiates light with longer wavelengths, generally in the yellow range. It should be noted that the phosphor layer 7 must be dense enough so that most of the light from the LED 3 is absorbed, but not so dense that light is emitted only from the bottom surface of the phosphor layer 7. Rather, the construction of the phosphor layer 7 must be such that light is emitted from both the top and bottom surfaces of the phosphor layer 7. The actual concentration and thickness of the phosphor layer 7 is engineered for each specific application based on the particular wavelengths of light emanating from the LED 3 and the desired spectral output of the system 1.

Figure 4:
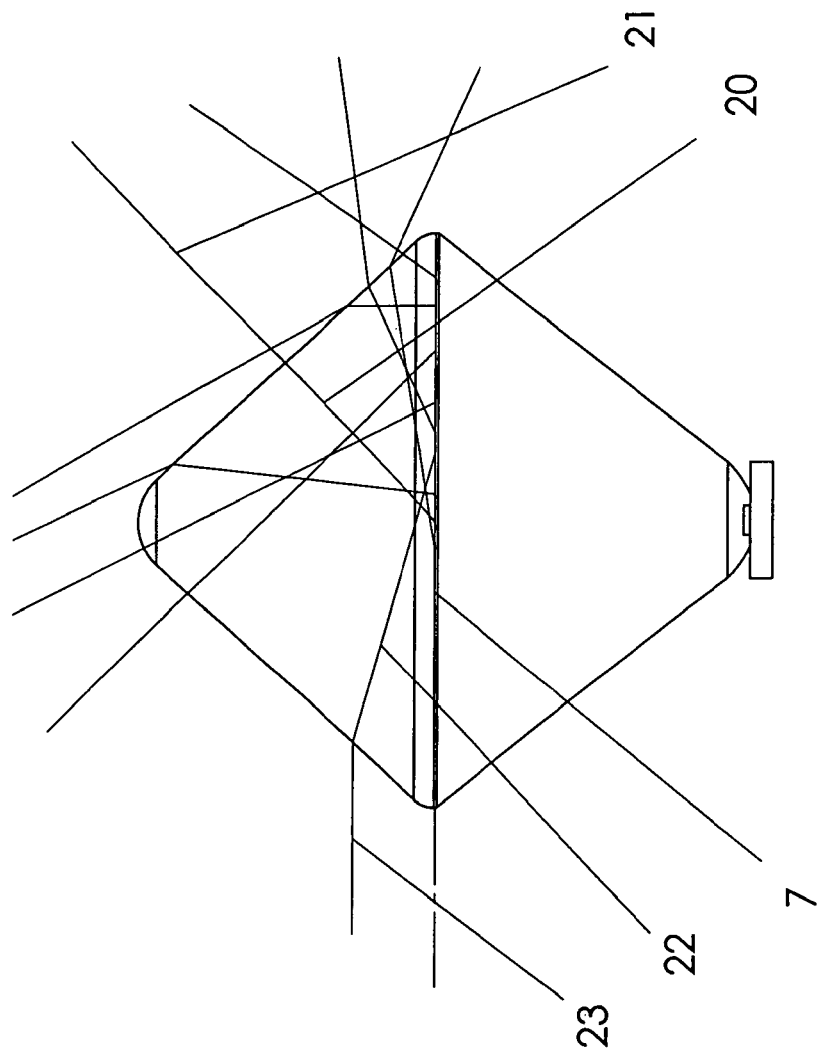
FIG. 4 is a side sectional view of the optical system showing light rays emanating from the top side of the phosphor layer.

FIG. 4 shows the paths of light rays emitted from the upper surface of phosphor layer 7. (The light rays emitted from the LED 3 before they contact the phosphor layer 7 are not shown in FIG. 4 for clarity of illustration.) Two classes of phosphor-generated light rays, first light rays 20 and second light rays 22 emanate upward from the upper surface of the phosphor layer 7. The first phosphor light rays 20 strike the surface of the cap 8 at an angle nearly normal to the surface of the cap 8. The first light rays 20 are not refracted as the exiting rays 21 travel from the relatively high index of refraction material of cap 8 to the low index medium air.

The second light rays 22 emanating from the upper surface of the phosphor layer 7 strike the surface of the cap 8 at more pronounced angles from normal. At the larger angle of impingement, second exiting rays 23 are slightly refracted as they travel from a high to a low index of refraction material, the polymer of cap 8 to air. All rays that strike the surface of the cap 8 at less than the TIR angle pass through the cap 8.

Figure 5:
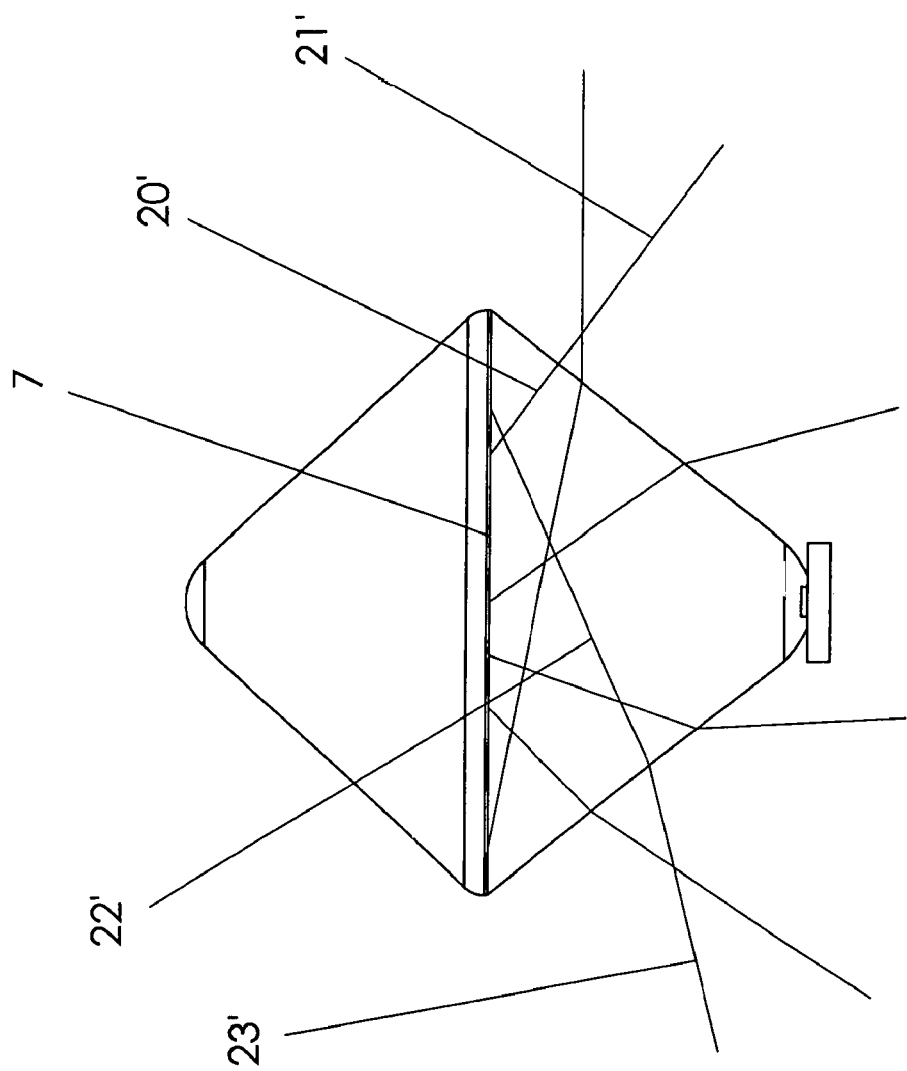
FIG. 5 is a side sectional view of the optical system showing light rays emanating from the bottom side of the phosphor layer.

FIG. 5 illustrates the travel paths of light generated by the lower surface of the phosphor layer 7. (As in FIG. 4, the light rays emitted from the LED 3 before they contact the phosphor layer 7 are not shown in FIG. 5 for clarity of illustration.) Two classes of phosphor-generated light rays, first light rays 20' and second light rays 22' emanate downward from the lower surface of the phosphor layer 7. The first rays 20' strike the surface of the base 6 at an angle nearly normal to the surface of the base 6. The first light rays 20' are not refracted as the exiting rays 21' travel from the relatively high index of refraction material of base 6 to the low index medium air.

The second light rays 22' emanating from the lower surface of the phosphor layer 7 strike the surface of the base 6 at more pronounced angles from normal. As with second exiting rays 23 in the cap 8, at the larger angle of impingement, second exiting rays 23' are slightly refracted as they travel from a high to a low index of refraction material, the polymer of base 6 to air. All rays that strike the surface of the base 6 at less than the TIR angle pass through the base 6.

FIG. 6 shows a third class of phosphor-generated light rays 21" emanating from the upper surface of the phosphor layer 7. The angle at which light rays 21" strike the surface of cap 8 is shallow enough relative to normal that light rays 24 TIR off of the surface of the cap 8. For the specific conformation of the system 1 illustrated in FIG. 6, an angle of less than 40 degrees would create a TIR reflection. The angle of the third class of light rays 21" is 60 degrees from normal. The TIR reflected ray 24 strikes the opposite side of the cap 8 at an angle that is less than the TIR angle. The specific angle is the difference between the conical angle of the cap 8 (87 degrees) and the angle of the first TIR reflection (60 degrees), or 27 degrees. The 27 degrees is much less than the TIR angle of 40 degrees. Therefore the third TIR reflected ray 24 does not TIR again and escapes the cap 8 and is refracted as third refracted ray 25. Constructing the optical system 1 so as to have a geometry in which TIR reflected rays hit a surface that is generally orthogonal to the TIR surface allows light to escape that would otherwise not escape the high index polymer.

It should be noted that although the above example was described mostly with reference to cap 8, base 6 allows light to escape in a similar manner. The same type of reflections occurs when light exits the lower surface of the phosphor layer 7 towards the LED 3 as occurs when light is emitted from the upper surface of the phosphor layer 7.

An example in which the optical system would not allow as great a percentage of the light to escape would be if the conical angle of the base and cap is 105 degrees. In that case, the TIR ray 24 would hit the surface at an angle of 45 degrees. 45 degrees is within the TIR range, and would therefore not allow the light to escape. The TIR light would end up reflecting back toward the phosphor layer.

A fourth class of phosphor-generated light rays 26 reflects back to the LED 3. This is the only light, except for that light absorbed by the polymer of the base and cap and the light absorbed by the reflective surface 5, emitted from the phosphor layer 7 that does not exit the system 1. It should also be noted that a very small amount of light might not find its way out of the system at the radius tip 9. The absorbed light is a very small percentage of the overall light generated by the system 1. In summary, nearly all of the light from the LED 3 is absorbed by the phosphor layer 7, and nearly all of the light emitted by the phosphor layer 7 exits the system 1.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

I claim:

1. A lighting assembly with an omnidirectional light output, comprising:
    a first light guide frustoconical in shape, the first light guide comprising a base, a light input surface opposite the base, and a first side wall extending between the base and the light input surface;
    an LED light source adjacent the light input surface;
    a second light guide conical or frustoconical in shape, the second light guide comprising a base, an apex region opposite the base, and a second side wall extending between the base and the apex region, the second light guide arranged base-to-base with the first light guide;
    a phosphor layer between the bases of the light guides, the first light guide guiding primary light generated by the light source to the phosphor layer directly and by total internal reflection at the first side wall; and
    a light transmission medium interposed between the light source and the light input surface, at least some of the light from the light source propagating by total internal reflection in the light transmission medium from the light source to the light input surface; wherein:
    the phosphor layer converts at least a portion of the primary light to secondary light of longer wavelengths, and outputs the secondary light into the first light guide and the second light guide; and
    the secondary light and an unconverted portion of the secondary light are output from the lighting assembly omnidirectionally through the first and second side surfaces of the light guides directly and after total internal reflection at the side surfaces.

2. The lighting assembly of claim 1, wherein at least some of the light from the light source directly propagates from the light source to the light input surface in the light transmission medium.

3. The lighting assembly of claim 1, wherein the light transmission medium comprises a polymer.

4. The lighting assembly of claim 1, wherein the light transmission medium and the first light guide are constructed of a single piece of material.

5. The lighting assembly of claim 4, wherein the light transmission medium comprises a polymer.

6. The lighting assembly of claim 1, wherein the light transmission medium is in contact with the light source.

7. The lighting assembly of claim 1, wherein the phosphor layer is larger in area than the light source.

8. The lighting assembly of claim 1, wherein the second light guide is frustoconical in shape.

9. The lighting assembly of claim 1, wherein at least one of the first light guide and the second light guide has a conical angle of less than 105 degrees.

10. The lighting assembly of claim 9, wherein the at least one of first light guide and the second light guide has a conical angle of about 87 degrees.

11. The lighting assembly of claim 1, wherein the light guides have respective conical angles configured such that the secondary light that is totally internally reflected exits the light guides after no more than one total internal reflection.

12. The lighting assembly of claim 1, wherein the light transmission medium comprises a reflective surface.

13. The lighting assembly of claim 1, wherein the reflective surface is provided by a reflective coating.

14. The lighting assembly of claim 1, wherein the light transmission medium comprises a high transmission material.

15. The lighting assembly of claim 1, wherein the light transmission material comprises a material having a high index of refraction.

16. The lighting assembly of claim 15, wherein the material is an oil.

17. The lighting assembly of claim 1, wherein the light source is contained within the light transmission medium.

18. The lighting assembly of claim 1, wherein the light transmission medium has a curved shape.

* * * * *